(12) United States Patent
Oyamada

(10) Patent No.: US 8,519,381 B2
(45) Date of Patent: Aug. 27, 2013

(54) ORGANIC SEMICONDUCTOR DEVICE, ORGANIC SOLAR CELL, AND DISPLAY PANEL

(75) Inventor: Takahito Oyamada, Machida (JP)

(73) Assignee: Pioneer Corporation, Tokyo (JP)

( * ) Notice: Subject to any disclaimer, the term of this patent is extended or adjusted under 35 U.S.C. 154(b) by 460 days.

(21) Appl. No.: 12/746,616

(22) PCT Filed: Dec. 27, 2007

(86) PCT No.: PCT/JP2007/075077
§ 371 (c)(1),
(2), (4) Date: Jun. 7, 2010

(87) PCT Pub. No.: WO2009/084078
PCT Pub. Date: Jul. 9, 2009

(65) Prior Publication Data
US 2010/0263727 A1 Oct. 21, 2010

(51) Int. Cl.
*H01L 51/40* (2006.01)

(52) U.S. Cl.
USPC .......... 257/40; 438/82; 438/99; 438/780; 257/E51.018; 257/E51.038; 257/E51.043

(58) Field of Classification Search
USPC .......... 438/82, 99, 780; 257/642, E51.018, 257/E51.026, E51.038, E51.043
See application file for complete search history.

(56) References Cited

U.S. PATENT DOCUMENTS

| | | | |
|---|---|---|---|
| 7,764,012 B2 * | 7/2010 | Yamazaki et al. | 313/503 |
| 7,868,957 B2 * | 1/2011 | Yamazaki et al. | 349/43 |
| 2002/0221088 | 2/2002 | Howard | |
| 2005/0231107 A1 * | 10/2005 | Yamazaki et al. | 313/506 |
| 2006/0214160 A1 | 9/2006 | Furukawa et al. | |
| 2007/0085112 A1 * | 4/2007 | Yamazaki et al. | 257/288 |
| 2008/0008905 A1 * | 1/2008 | Yamazaki | 428/690 |
| 2009/0199903 A1 | 8/2009 | Oyamada et al. | |
| 2010/0263727 A1 * | 10/2010 | Oyamada | 136/263 |
| 2010/0264407 A1 | 10/2010 | Murata et al. | |

FOREIGN PATENT DOCUMENTS

| | | |
|---|---|---|
| GB | 2352327 | 1/2001 |
| JP | 10-041070 | 2/1998 |

(Continued)

OTHER PUBLICATIONS

International Search report, PCT/JP2007/075077, Feb. 12, 2008.

(Continued)

*Primary Examiner* — David Vu
*Assistant Examiner* — Earl Taylor
(74) *Attorney, Agent, or Firm* — Young & Thompson

(57) ABSTRACT

An organic semiconductor device includes, between a pair of electrodes of a first metal electrode and a second electrode, at least, a light-emitting layer, a hole injection layer which removes holes from the first metal electrode, a hole transporting layer formed on the light-emitting layer on a side of the first metal electrode for transporting the holes removed by the hole injection layer to the light-emitting layer, and an electron transporting layer formed on the light-emitting layer on a side of the second electrode for removing electrons from the second electrode and transporting the electrons to the light-emitting layer, wherein the organic semiconductor device further includes a crystallinity controlling member which is a series of discontinuous clusters along the contact surface of the hole injection layer that is in contact with the first metal electrode, for controlling an orientation of crystalline molecules.

13 Claims, 10 Drawing Sheets

(56) References Cited

FOREIGN PATENT DOCUMENTS

| | | |
|---|---|---|
| JP | 2000-340367 | 12/2000 |
| JP | 2003-272870 | 9/2003 |
| JP | 2006-255878 | 9/2006 |
| JP | 2006-303459 | 11/2006 |
| JP | 2007-059457 | 3/2007 |
| JP | 2007-258235 | 10/2007 |
| WO | 2008001577 | 1/2008 |
| WO | 2009063859 | 5/2009 |

OTHER PUBLICATIONS

P. Sullivan et al., "Structurral templating as a route to improved photovoltaic performance in copper phthalocyanine /fullerene (C60) heterojunction" Applied Physics Letters, vol. 91, 233114 (2007).

Forsythe et al., "Influence of Copper Phthalocynanine on the Charge Injection and Growth Modes for Organic Light Emitting Diodes", J. Vec Sci. Technol. A 18(4), Jul./Aug. 2000.

Korean Official Action—10-2010-7012329—Dec. 9, 2011.

\* cited by examiner

FIG. 11

| COHESION MOLECULE MATERIAL | | None | MoO₃ | C₆₀ | Aℓq₃ |
|---|---|---|---|---|---|
| ANODE | Au | | 20nm | | |
| COHESION MOLECULE | | 0 | | 3nm | |
| CRYSTALLINE MOLECULE | CuPc | | 15nm | | |
| HOLE TRANSPORTING LAYER | NPB | | 35nm | | |
| LIGHT-EMITTING LAYER | Aℓq₃ | | 60nm | | |
| ELECTRON INJECTION LAYER | Li₂O | | 1nm | | |
| CATHODE | Aℓ | | 80nm | | |
| DRIVING VOLTAGE | | 13.8 | 5.7 | 5.8 | 10.1 |
| BRIGHTNESS | | 270 | 339 | 334 | 385 |

FIG. 12

| COHESION MOLECULE MATERIAL | | None | MoO₃ | C₆₀ | Aℓq₃ |
|---|---|---|---|---|---|
| ANODE | Au | | 20nm | | |
| COHESION MOLECULE | | 0 | | 3nm | |
| CRYSTALLINE MOLECULE | Pentacene | | 15nm | | |
| HOLE TRANSPORTING LAYER | NPB | | 35nm | | |
| LIGHT-EMITTING LAYER | Aℓq₃ | | 60nm | | |
| ELECTRON INJECTION LAYER | Li₂O | | 1nm | | |
| CATHODE | Aℓ | | 80nm | | |
| DRIVING VOLTAGE | | 9.1 | 3.9 | 4.4 | 9.4 |
| BRIGHTNESS | | 50 | 241 | 265 | 371 |

FIG. 13

| ANODE | 20nm | Au | | | |
|---|---|---|---|---|---|
| COHESION MOLECULE | 3nm | None | MoO₃ | C₆₀ | Aℓq₃ |
| SURFACE ROUGHNESS | | 2.6nm | 9.3nm | 6.5nm | 3.5nm |

GLASS SUBSTRATE: OMITTED

ORGANIC SEMICONDUCTOR DEVICE, ORGANIC SOLAR CELL, AND DISPLAY PANEL

CROSS-REFERENCE TO RELATED APPLICATION

This is an application PCT/JP2007/75077, filed Dec. 27, 2007, which was not published under PCT article 21(2) in English.

BACKGROUND OF THE INVENTION

1. Field of the Invention

The present invention relates to an organic semiconductor device, etc., that causes a light-emitting layer to emit light in accordance with an applied voltage provided between a pair of electrodes.

2. Description of the Related Art

In recent years, the development of flat displays has blossomed. In such flat displays, display devices that employ an organic semiconductor device such as an organic electroluminescent device, etc., have become commonplace. Various studies have been conducted with the organic semiconductor devices of recent years on the use of traditionally employed transparent electrodes such as ITO (indium tin oxide) as well as a variety of other materials.

For example, in known organic semiconductor devices as shown in The Journal of Vacuum Science and Technology A (July/August 2000), there exists technology in which fullerene ($C_{60}$) and phthalocyanine (CuPc) are layered on an electrode made of a metal material and formed on a substrate to facilitate hole removal from the electrode. As a result, a greater number of holes are injected into the light-emitting layer, thereby reducing the driving voltage to be applied between the anode and cathode.

While the configuration of the above-described prior art contributes to a reduction in the driving voltage to a certain degree, a hole transporting layer that removes a great number of holes from the anode with even greater efficiency, thereby enabling the organic semiconductor device to operate under an even lower driving voltage has been desired.

SUMMARY OF THE INVENTION

The above-described problem is given as an example of the problems that are to be solved by the present invention.

MEANS OF SOLVING THE PROBLEM

In order to achieve the above-described object, according to the first invention, there is provided an organic semiconductor device comprising: a first metal electrode, a hole injection layer, a hole transporting layer, a light-emitting layer, an electron injection layer, and a second electrode layered in that order from a bottom layer on a substrate, the hole injection layer removing holes from the first metal electrode; the hole transporting layer supplying holes removed by the hole injection layer to the light-emitting layer; and the electron injection layer removing electrons from the second electrode and supplies the electrons to the light-emitting layer; wherein: the organic semiconductor device further comprises a crystallinity controlling member which is a series of discontinuous clusters along a contact surface of the hole injection layer in contact with the first metal electrode, for controlling an orientation of crystalline molecules of the hole injection layer; the crystallinity controlling member is cohesion molecules that differ from molecules of the material constituting the hole injection layer; and each of the crystalline molecules has an orientation greater than or equal to 1 degree and less than or equal to 90 degrees with respect to the substrate.

In order to achieve the above-described object, according to the 14th invention, there is provided an organic solar cell comprising: a first metal electrode, a photoelectric conversion layer, an electron transporting layer, and a second electrode layered in that order from a bottom layer on a substrate, the photoelectric conversion layer separating exciters generated on a boundary surface between a P-type material and an N-type material that absorb light into holes and charges; and the electron transporting layer removing the charges from the photoelectric conversion layer and transports the charges to the second electrode; wherein: the organic solar cell further comprises a crystallinity controlling member which is a series of discontinuous clusters along a contact surface of the photoelectric conversion layer in contact with the first metal electrode, for controlling an orientation of crystalline molecules of the photoelectric conversion layer; the crystallinity controlling member is cohesion molecules that differ from the molecules of the material constituting the electron transporting layer; and each of the crystalline molecules has an orientation greater than or equal to 1 degree and less than or equal to 90 degrees with respect to the substrate.

In order to achieve the above-described object, according to the 15th invention, there is provided a display panel comprising an organic semiconductor device comprising: a first metal electrode, a hole injection layer, a hole transporting layer, a light-emitting layer, an electron injection layer, and a second electrode layered in that order from a bottom layer on a substrate, the hole injection layer removing holes from the first metal electrode; the hole transporting layer supplying holes removed by the hole injection layer to the light-emitting layer; and the electron injection layer removing electrons from the second electrode and supplies the electrons to the light-emitting layer; wherein: the organic semiconductor device further comprises a crystallinity controlling member which is a series of discontinuous clusters along a contact surface of the hole injection layer in contact with the first metal electrode, for controlling an orientation of crystalline molecules of the hole injection layer; the crystallinity controlling member is cohesion molecules that differ from the molecules of the material constituting the hole injection layer; and each of the crystalline molecules has an orientation greater than or equal to 1 degree and less than or equal to 90 degrees with respect to the substrate.

BRIEF DESCRIPTION OF THE DRAWING

FIG. 11 is a table illustrating an example of the verification results of the driving voltage of the organic electroluminescent device.

FIG. 12 is a table illustrating an example of the verification results of the driving voltage of the organic electroluminescent device.

FIG. 13 is a table illustrating a verification example of surface roughness of the anode on the glass substrate, and of each case of cohesion molecules that exist on that anode.

DETAILED DESCRIPTION OF THE PREFERRED EMBODIMENTS

The following describes an embodiment of the present invention with reference to accompanying drawings.

Embodiment 1

Figure 1:
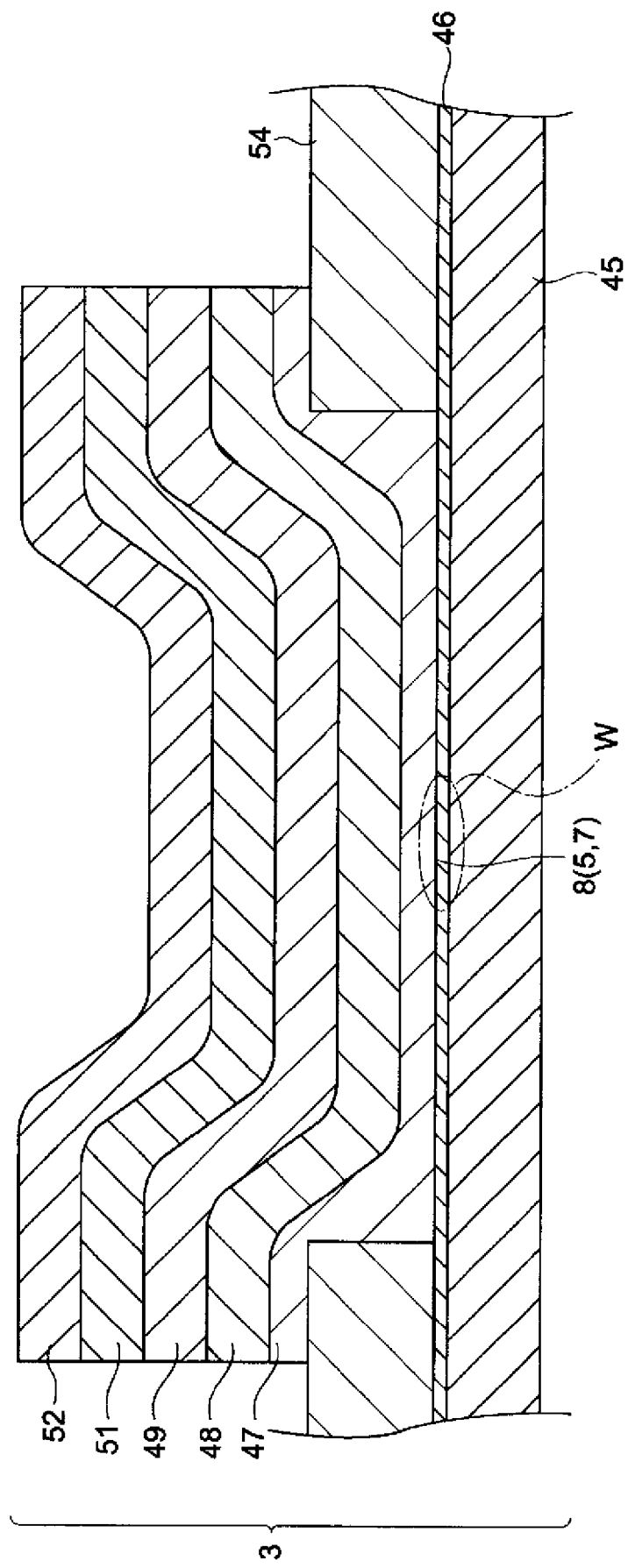
FIG. 1 is a partial cross-sectional view illustrating a configuration example of the organic electroluminescent device of the display panel of embodiment 1, as enlarged.

FIG. 1 is a partial cross-sectional view illustrating an example of a case where an organic semiconductor device of embodiment 1 is applied to an organic electroluminescent device 3 of a display panel.

The organic electroluminescent device 3 is an example of an organic semiconductor device, and is formed correspondingly to the colors red, green, and blue, for example. The organic electroluminescent device 3 shown in the figure is for one pixel section.

This organic electroluminescent device 3 is structured so that an anode 46, a hole injection layer 47, a hole transporting layer 48, a light-emitting layer 49, an electron injection layer 51, and a cathode 52 are layered in that order on a glass substrate 45. Note that the organic electroluminescent device 3 may employ a structure wherein an electric charge and exciter diffusion layer for capturing an electric charge and exciter within the light-emitting layer 49 is layered.

The glass substrate 45 is formed by a transparent, semi-transparent, or non-transparent material. The above-described anode 46 is formed to cover the glass substrate 45. This anode 46 has a function of supplying holes to the light-emitting layer 49 described later. The anode 46 may be made of a material other than the aforementioned Au as well, such as Ag, Cu, ITO (indium tin oxide), or IZO (indium zinc oxide), for example. Further, the anode 46 may also employ Al, Mo, or Ti, for example. In this embodiment, the anode 46 is a metal electrode mainly made of Au.

The hole injection layer 47 has a function of facilitating the removal of holes from the anode 46. This hole injection layer 47 has crystalline molecules 9 of a material such as CuPc or pentacene, for example. These crystalline molecules 9 will be described later. The above-described hole transporting layer 48 has a function of transporting the holes removed from the anode 46 by the hole injection layer 47 to the light-emitting layer 49. The hole transporting layer 48 is made of a material such as NPB (amorphous), for example.

The hole transporting layer 48 exists between the hole injection layer 47 and the light-emitting layer 49, and has a function of suppressing a decrease in brightness of the light emitted by the light-emitting layer 49 by thus separating the hole injection layer 47 and the light-emitting layer 49. This suppression occurs because energy no longer moves to the hole injection layer 47 made of a CuPc material which absorbs energy (exciters) generated within the light-emitting layer 49 in the visible region (that is, that has a small energy gap), making it difficult for brightness to decrease. This holds true for cases where the hole injection layer 47 is made of pentacene as well. Note that even if there is a large energy gap with the crystalline molecules 9 of the hole injection layer 47, such a decrease in brightness does not readily occur. The hole transporting layer 48 is made of a material such as NPB, for example, thereby preventing a decrease in brightness owing to the large energy gap from Alq₃. That is, the aforementioned hole transporting layer 48 is made of the material NPB, which is generally used as a hole transportable material having hole mobility and, in this embodiment, fulfills the function of improving luminous efficiency and serving as a suppression layer.

The above-described light-emitting layer 49 is a light-emitting device that is made of an organic material, for example, and employs a so-called electroluminescence (EL) phenomenon. The light-emitting layer 49 is layered between any of the layers between the plurality of electrodes 46 and 52, and has a function of emitting light by an electric field generated between the plurality of electrodes 46 and 52 by an applied voltage. This light-emitting layer 49 outputs its own light by utilizing a phenomenon in which light is emitted based on energy received from an external source using an electric field.

In this embodiment, this light-emitting layer 49 is described as a layer having a function of a so-called electron transporting layer as well. Here, a function of an electron transporting layer refers to a function of efficiently transporting the electrons removed from the cathode 52 by the electron injection layer 51 to the light-emitting layer 49. Note that an electron transporting layer separate from the light-emitting layer 49 may be independently formed between the light-emitting layer 49 and the electron injection layer 51 rather than provided as a function of the light-emitting layer 49.

The electron injection layer 51 is stacked on the light-emitting layer 49. This electron injection layer 51 has a function of facilitating removal of electrons from the cathode 52. The cathode 52 is formed on the electron injection layer 51. Note that the electron injection layer 51 may also include a function of a buffer layer or the cathode 52. In the organic electroluminescent device 3, the light-emitting layer 49 outputs visible light by an electric field in accordance with the voltage applied between the anode 46 and the cathode 52.

In the organic electroluminescent device 3, a crystallinity controlling member 8 exists along the top surface of the hole injection layer 47 that is in contact with the anode 46. In this embodiment, the existence of this crystallinity controlling member 8 improves the injection rate, and decreases the driving voltage and/or extends the service life of the device, for example.

This crystallinity controlling member 8 has a function of controlling the orientation of an organic semiconductor material having planarity, for example. The crystallinity controlling member 8 is a series of discontinuous clusters along the contact surface of the hole injection layer 47 that is in contact with the anode 46 (first metal electrode), and is a member that controls the orientation of the crystalline molecules 9 described later.

Here, the "series of discontinuous clusters" may refer to a structure having an uneven shape, for example. The crystallinity controlling member 8, as such a series of clusters, may be a cluster object or film. That is, the "series of discontinuous clusters" may be a thin film having a rate of coverage of the surface of the anode 46 of greater than or equal to 1% to less than 100%.

The crystallinity controlling member 8 has a function of controlling the orientation of planar molecules and/or rod-shaped molecules, which are employed as examples of crystalline molecules 9 on the top surface of the hole injection layer 47, thereby controlling the orientation of these crystalline molecules 9. The crystallinity controlling member 8 thus controls the orientation of the crystalline molecules 9, facilitating removal of holes from the anode 46 and, in turn, making it possible to decrease the driving voltage to be applied between the anode 46 and the cathode 52.

FIGS. 2 to 7 are each a cross-sectional view illustrating a configuration example in a case where a specific range W illustrated in FIG. 1 is enlarged. Note that the layer configuration illustrated in FIGS. 2 to 7 shows each layer having a thickness that differs from actually for clarity of explanation.

Figure 2:
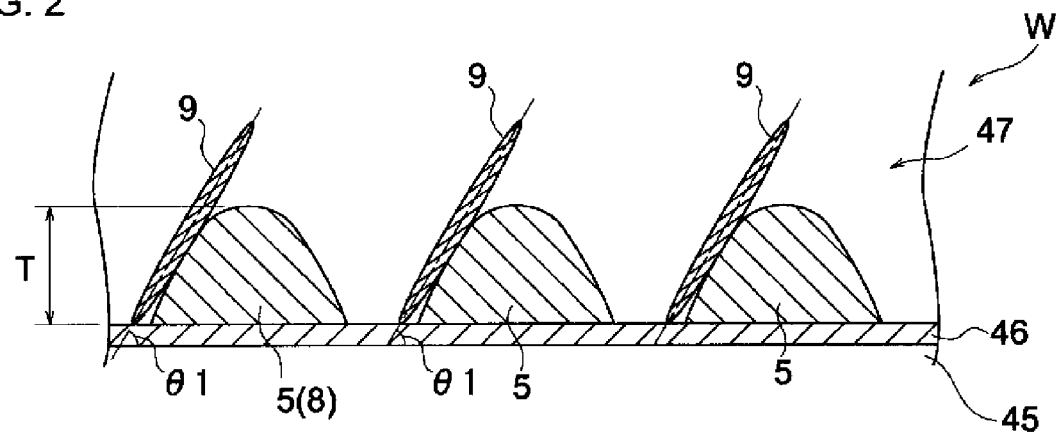
FIG. 2 is a cross-sectional view illustrating a configuration example in a case where the specific range shown in FIG. 1 is enlarged.
Figure 3:
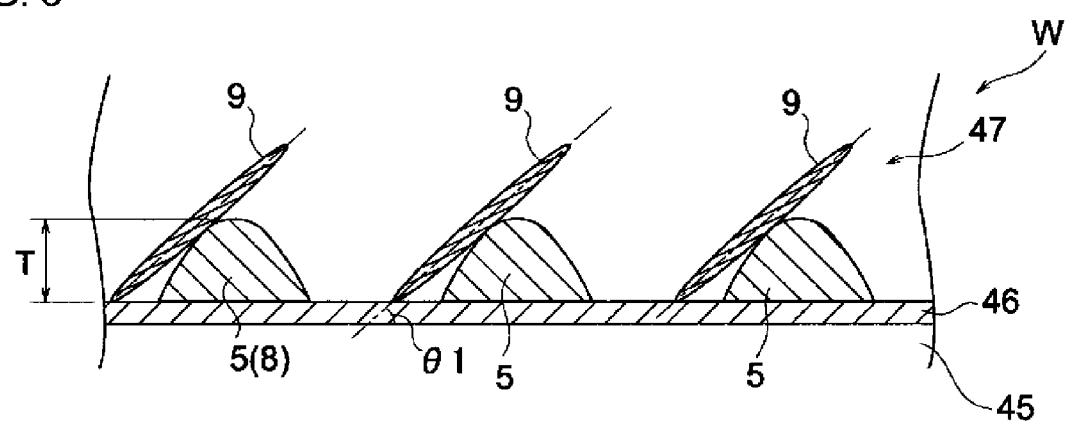
FIG. 3 is a cross-sectional view illustrating a configuration example in a case where the specific range shown in FIG. 1 is enlarged.
Figure 4:
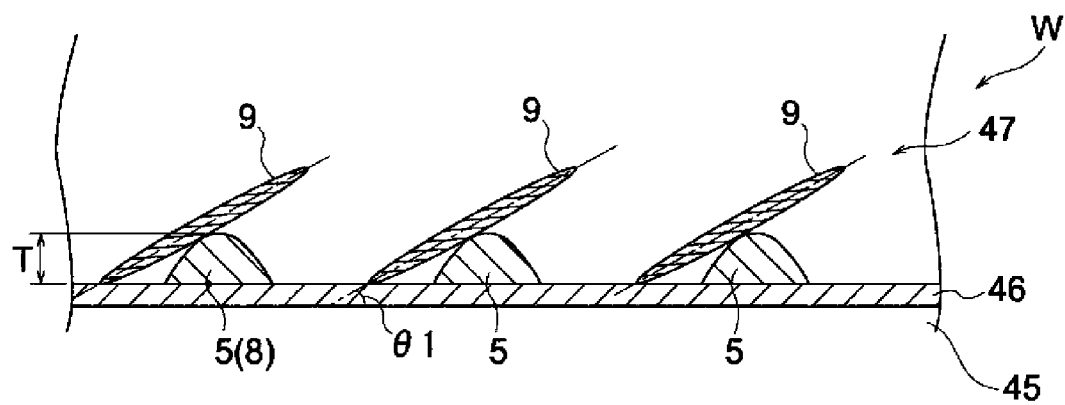
FIG. 4 is a cross-sectional view illustrating a configuration example in a case where the specific range shown in FIG. 1 is enlarged.
Figure 5:
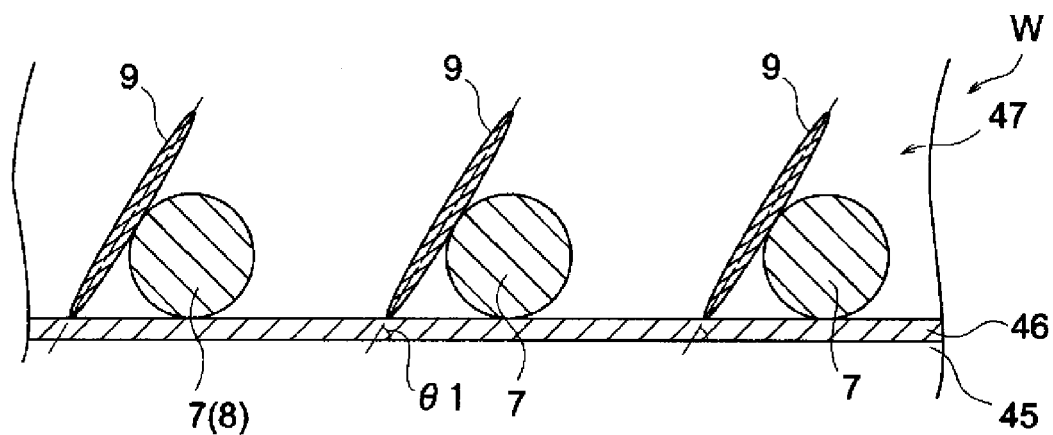
FIG. 5 is a cross-sectional view illustrating a configuration example in a case where the specific range shown in FIG. 1 is enlarged.
Figure 6:
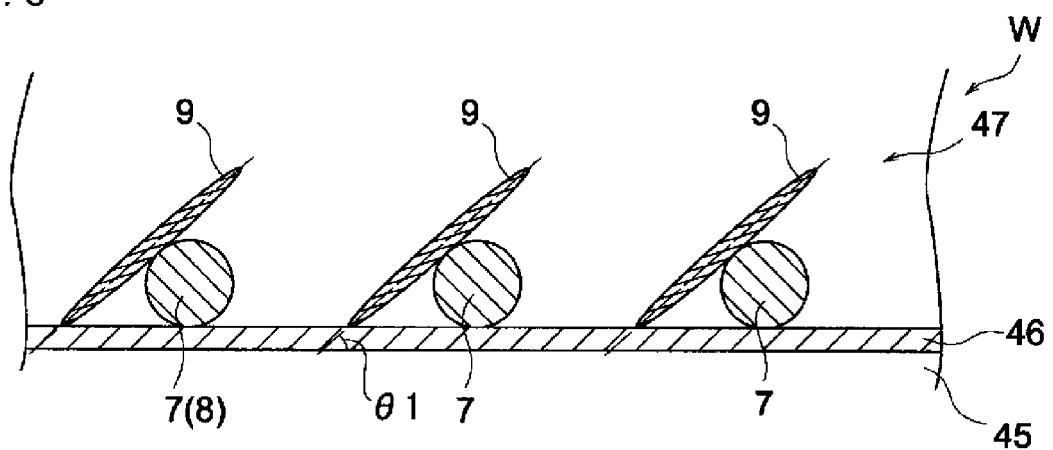
FIG. 6 is a cross-sectional view illustrating a configuration example in a case where the specific range shown in FIG. 1 is enlarged.
Figure 7:
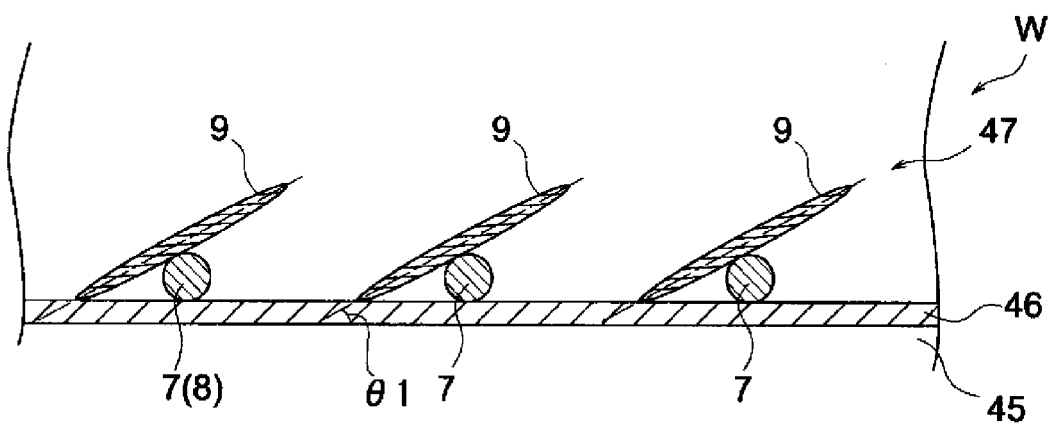
FIG. 7 is a cross-sectional view illustrating a configuration example in a case where the specific range shown in FIG. 1 is enlarged.

FIG. 2 to FIG. 4 illustrate a state in which a cohesion matter 5 having a cross-sectional shape of a mountain is incorporated as the series of discontinuous clusters that serves as the crystallinity controlling member, and FIG. 5 to FIG. 7 illustrate a state in which a cohesion matter 7 having a cross-sectional shape of a circle is incorporated as the series of discontinuous clusters that serves as the crystallinity controlling member.

First, the aforementioned crystallinity controlling member 8 is the cohesion matter 5 incorporated to form an uneven shape on the top surface of the hole injection layer 47, for example. In this embodiment, cohesion molecules that differ from the molecules of the material that forms the hole injection layer 47, for example, are used as the cohesion matter 5. Examples of the material used to form the hole injection layer 47 include a hole injection material such as pentacene. On the other hand, either molybdenum oxide ($MoO_3$), $C_{60}$ (fullerene) or $Alq_3$ may be alternatively selected as the cohesion molecules.

That is, $MoO_3$ (molybdenum oxide) may be incorporated, or $C_{60}$ (fullerene) may be incorporated, or $Alq_3$ may be incorporated as the cohesion molecules in the hole injection layer 47.

In FIG. 2, planar or bar-shaped crystalline molecules 9 are disposed along the anode 46 on the top surface of the hole injection layer 47 facing the anode 46. The orientation of each crystalline molecule 9 is controlled by the cohesion matter 5 so that the angular orientation with respect to the substrate 45 is $\theta 1$. That is, the crystallinity of each crystalline molecule 9 is controlled. The crystalline molecule 9 that is thus orientation-controlled has an orientation greater than or equal to 1 degree and less than or equal to 90 degrees with respect to the substrate 45.

The cohesion matter 5 has a discontinuous film shape when viewed in its entirety, and a thickness of about a thickness T. The thickness T is, for example, about 0.1 nm to 10 nm. The cohesion matter 5 changes shape when the cohesion molecules are incorporated in accordance with at least, for example, one of the following conditions: molecular size, cohesive force, affinity for the top surface of the first metal electrode 46, and coverage. The molecular size referred to here is, for example 0.1 nm (1 Å) or greater. Further, the material employed as the organic semiconductor material thus orientation-controlled may be a material having minimal intermolecular spacing, such as 0.1 [nm] (1 Å) for example, and uniform crystallinity.

The cohesion molecules are self-cohered, even if the material has a small molecular size, for example, making it possible to form a structure having a coverage greater than or equal to 1% and less than 100%. When the coverage of the first metal electrode 46 by the cohesion molecules is thus less than 100%, the cohesion molecules does not cover the entire surface of the first metal electrode 46, causing electrical contact to remain between the first metal electrode 46 and the electron transporting layer 50, thereby maintaining the flow of electric current.

Further, when there is affinity for the top surface of the first metal electrode 46, the cohesion molecules and the first metal electrode 46 have affinity for one another, thereby improving wettability and causing the cohesion molecules to readily become familiar with the first metal electrode 46 and increase smoothness. On the other hand, if there is affinity and hydrophobic properties between the cohesion molecules and the first metal electrode 46, wettability is poor, making it easier to form a film structure having a coverage greater than or equal to 1% and less than 100%.

In FIG. 3, while the crystalline molecules 9 are similarly disposed along the anode 46, the angular orientation $\theta 1$ is smaller than the case of FIG. 5 due to the small size of the incorporated cohesion matter 2. In FIG. 4 as well, while the crystalline molecules 9 are similarly disposed along the anode 46, the angular orientation $\theta 1$ is even smaller than the case of FIG. 3 due to the even smaller size of the incorporated cohesion matter 5.

In FIG. 5, planar or bar-shaped crystalline molecules 9 are disposed along the anode 46 on the top surface of the hole injection layer 47 facing the anode 46. The orientation of each of the crystalline molecules 9 is controlled by the cohesion matter 5 having a substantially circular cross-sectional shape so that the angular orientation with respect to the substrate 45 is $\theta 1$. That is, the crystallinity of each crystalline molecule 9 is controlled.

In FIG. 6, while the crystalline molecules 9 are similarly disposed along the anode 46, the angular orientation $\theta 1$ is smaller than the case of FIG. 5 due to the small size of the incorporated cohesion matter 5. In FIG. 7 as well, while the crystalline molecules 9 are similarly disposed along the anode 46, the angular orientation $\theta 1$ is even smaller than the case of FIG. 6 due to the even smaller size of the incorporated cohesion matter 5.

An example of the verification results of the driving voltage of the organic electroluminescent device 3 will now be described with reference to FIG. 1 to FIG. 7, with the organic electroluminescent device 3 built into the display panel having a configuration such as described in the example above.

Verification of Orientation Control by X-Ray Diffraction

Figure 8:
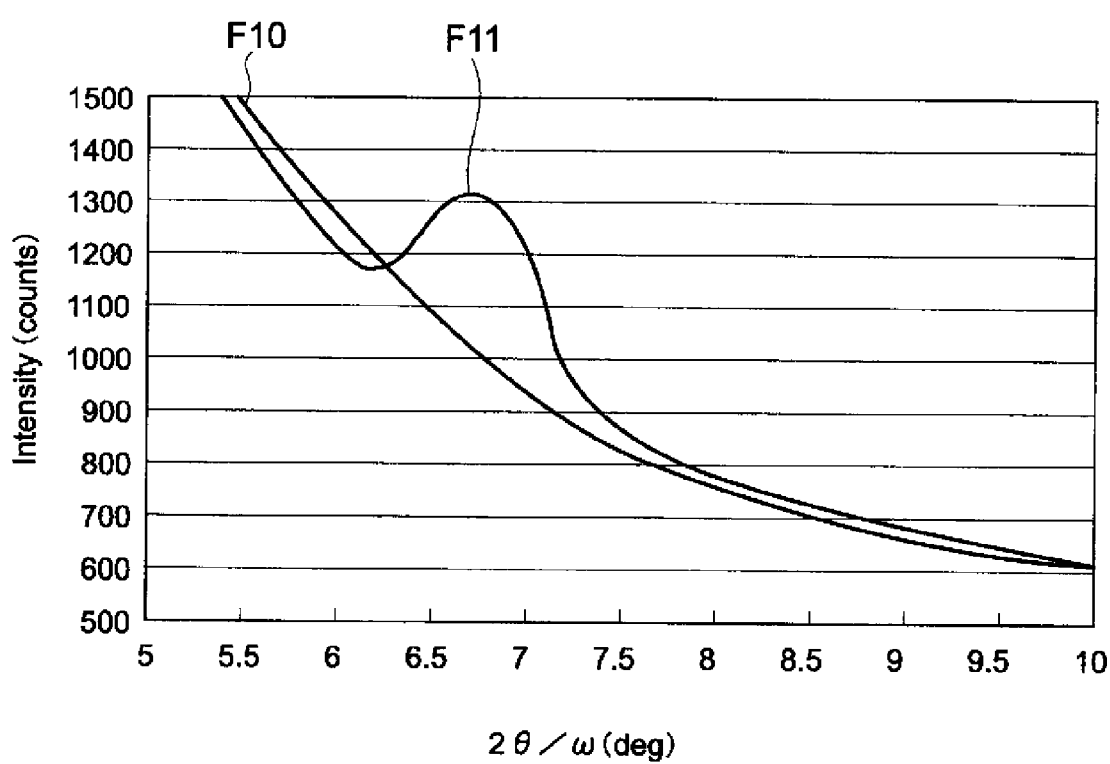
FIG. 8 is a diagram illustrating an example of the verification results of orientation control by X-ray diffraction.
Figure 9:
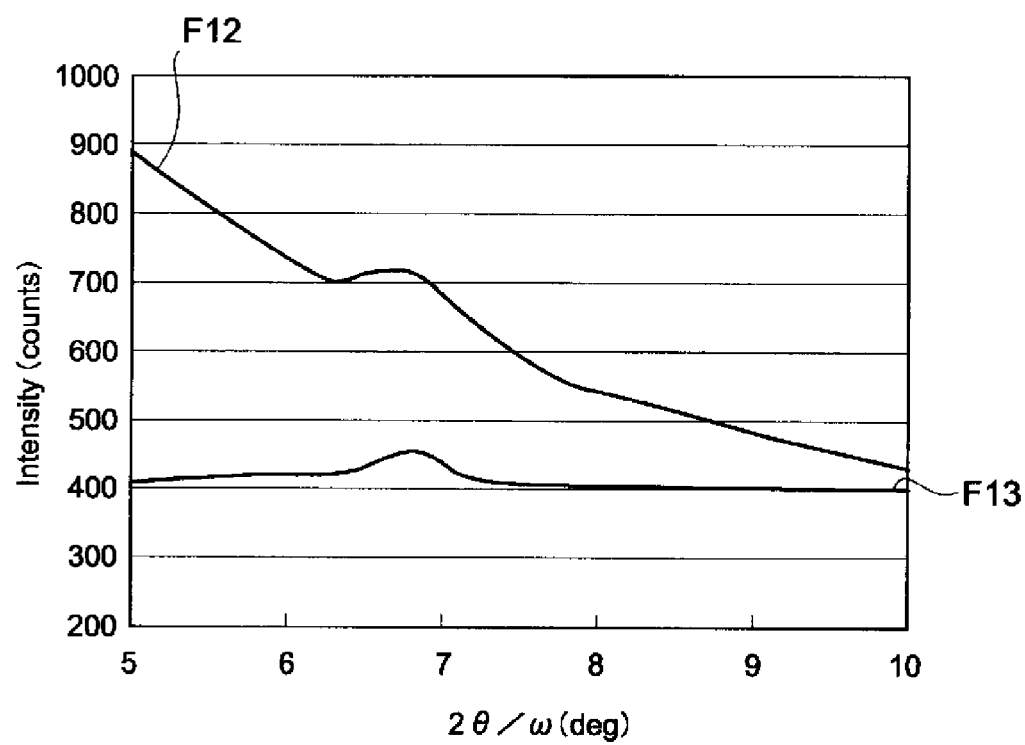
FIG. 9 is a diagram illustrating an example of the verification results of orientation control by X-ray diffraction.
Figure 10:
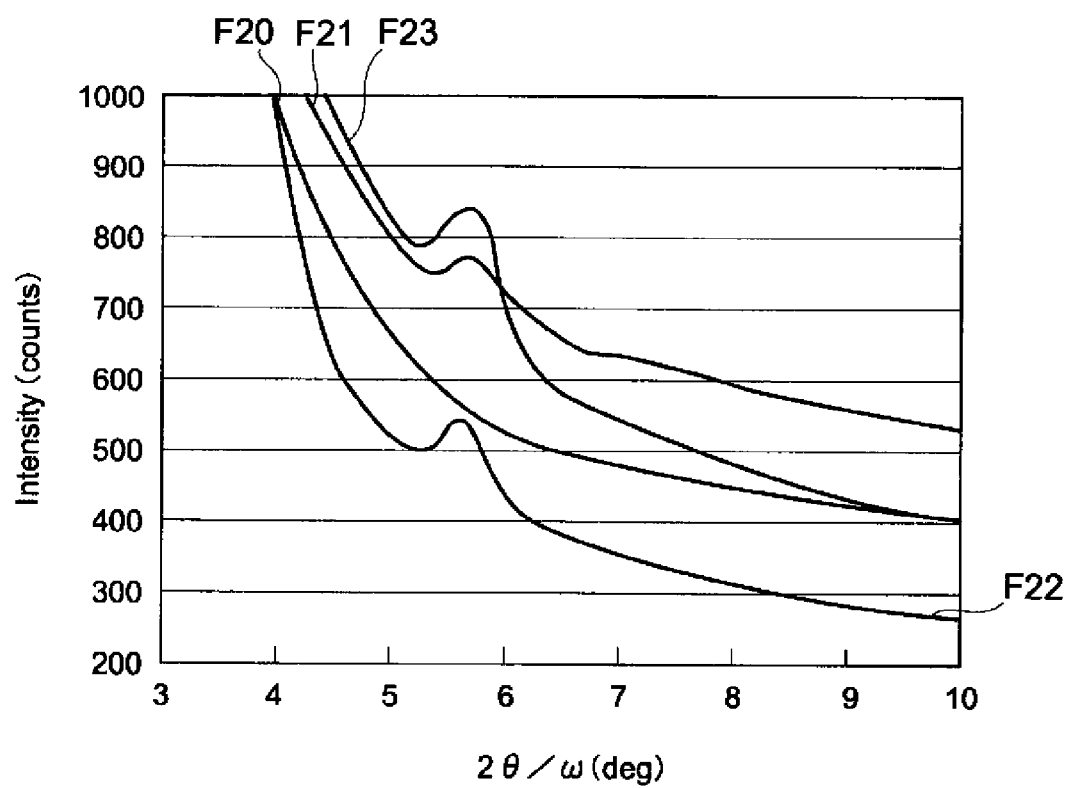
FIG. 10 is a diagram illustrating an example of the verification results of orientation control by X-ray diffraction.

FIG. 8 to FIG. 10 each illustrate an example of verification results of orientation control by X-ray diffraction. Note that the horizontal axis indicates the X-ray angle of incidence $2\theta/\omega$ [deg], and the vertical axis indicates intensity [counts]. In these figures, orientation is preferably controlled at an X-ray angle of incidence of $2\theta/\omega$ [deg] in the section where the peak occurs. Note that while this embodiment is described in connection with an illustrative scenario in which the substrate is the aforementioned glass substrate 45, the substrate may be a material such as Si, for example.

When the Crystalline Molecule 9 Contains CuPc

Orientation control characteristics F10 shown in FIG. 8 represent a case where Au (gold) and CuPc are used as the materials for the anode 46 formed on the glass substrate 45, and NPB is used as the material for the hole transporting layer 48. Note that the materials of the layer components other than those of the hole transporting layer 48, etc., are the same as those described above, and descriptions of the verification of orientation control thereof will be omitted. In order to explain the superiority of this embodiment, the orientation control characteristics F10 represent the orientation characteristics in a case where a known layer configuration is employed, and a peak does not appear.

On the other hand, orientation control characteristics F11 represent a case where Au (gold) is used as the materials for the anode 46 formed on the glass substrate 45, $C_{60}$ and CuPc are respectively used as the materials for the cohesion molecule 7 and the crystalline molecule 9 of the crystallinity controlling member 8, and NPB is used as the material for the hole transporting layer 48. Note that the materials of the layer components after the hole transporting layer 48 are the same as those described above, and descriptions of the verification thereof will be omitted. The orientation control characteristics F11 represent a case where the layer component of the crystallinity controlling member 8 of this embodiment is employed. With the orientation control characteristics F11, a peak appears when the X-ray angle of incidence 2θ/ω is approximately 6.84 [deg]. At this time, the crystalline molecule 9 of the crystallinity controlling member 8 is positioned in a vertical direction with respect to the glass substrate 45, indicating that the orientation of the crystalline molecule 9 is well controlled.

Further, orientation control characteristics F12 shown in FIG. 9 represent a case where Au (gold) is used as the material for the anode 46, MoO3 and CuPc are respectively used as the materials for the cohesion molecule 7 and the crystalline molecule 9 of the crystallinity controlling member 8, and NPB is used as the material for the hole transporting layer 48. The orientation control characteristics F12 represent a case where the layer component of the crystallinity controlling member 8 of this embodiment is employed. With the orientation control characteristics F12, a peak appears when the X-ray angle of incidence 2θ/ω is approximately 6.8 [deg]. At this time, the crystalline molecule 9 of the crystallinity controlling member 8 is positioned in a vertical direction with respect to the glass substrate 45, indicating that the orientation of the crystalline molecule 9 is well controlled.

Further, orientation control characteristics F13 shown in FIG. 9 represent a case where Au (gold) is used as the material for the anode 46, $Alq_3$ and CuPc are respectively used as the materials for the cohesion molecule 7 and the crystalline molecule 9 of the crystallinity controlling member 8, and NPB is used as the material for the hole transporting layer 48. The orientation control characteristics F13 represent a case where the layer component of the crystallinity controlling member 8 of this embodiment is employed. With the orientation control characteristics F13, a peak appears when the X-ray angle of incidence 2θ/ω is approximately 6.8 [deg]. At this time, the crystalline molecule 9 of the crystallinity controlling member 8 is positioned in a vertical direction with respect to the glass substrate 45, indicating that the orientation of the crystalline molecule 9 is well controlled.

When the Crystalline Molecule 9 Contains Pentacene

Orientation control characteristics F20 shown in FIG. 10 represent a case where Au (gold) and pentacene are used as the materials for the anode 46, and NPB is used as the material for the hole transporting layer 48. In order to explain the superiority of this embodiment, the orientation control characteristics F20 indicate the orientation characteristics in a case where a known layer configuration is employed, and a peak does not appear.

On the other hand, with orientation control characteristic F21, Au (gold) is used as the material for the anode 46, $C_{60}$ and pentacene are respectively used as the materials for the cohesion molecule 7 and the crystalline molecule 9 of the crystallinity controlling member 8, and NPB is used as the material for the hole transporting layer 48. The orientation control characteristics F21 represent a case where the layer component of the crystallinity controlling member 8 of this embodiment is employed. With the orientation control characteristics F21, a peak appears when the X-ray angle of incidence 2θ/ω is approximately 6.84 [deg]. At this time, the crystalline molecule 9 of the crystallinity controlling member 8 is positioned in a vertical direction with respect to the glass substrate 45, indicating that the orientation of the crystalline molecule 9 is well controlled.

Further, orientation control characteristics F22 shown in FIG. 10 represent a case where Au (gold) is used as the material for the anode 46, $MoO_3$ and pentacene are respectively used as the materials for the cohesion molecule 7 and the crystalline molecule 9 of the crystallinity controlling member 8, and NPB is used as the material for the hole transporting layer 48. The orientation control characteristics F22 represent the layer component of the crystallinity controlling member 8 of this embodiment. With the orientation control characteristics F22, a peak appears when the X-ray angle of incidence 2θ/ω is approximately 6.8 [deg]. At this time, the crystalline molecule 9 of the crystallinity controlling member 8 is positioned in a vertical direction with respect to the glass substrate 45, indicating that the orientation of the crystalline molecule 9 is well controlled.

Further, orientation control characteristics F23 shown in FIG. 10 represent a case where Au (gold) is used as the material for the anode 46, $Alq_3$ and pentacene are respectively used as the materials for the dissimilar molecule 7 and the crystalline molecule 9 of the crystallinity controlling member 8, and NPB is used as the material for the hole transporting layer 48. The orientation control characteristics F23 represent a case where the layer component of the crystallinity controlling member 8 of this embodiment is employed. With the orientation control characteristics F23, a peak appears when the X-ray angle of incidence 2θ/ω is approximately 6.8 [deg]. At this time, the crystalline molecule 9 of the crystallinity controlling member 8 is positioned in a vertical direction with respect to the glass substrate 45, indicating that the orientation of the crystalline molecule 9 is well controlled.

Verification of Driving Voltage

FIG. 11 and FIG. 12 are tables respectively showing examples of the verification results of the driving voltage of the organic electroluminescent device 3. In FIG. 11 and FIG. 12, the illustrative examples use phthalocyanine (CuPc) and pentacene, respectively, as the material of the crystalline molecule 9.

These verifications verify how the driving voltage changes in accordance with the combination of the material of the crystalline molecules 9 and the material of the cohesion molecules, under the verification conditions described later.

In the illustrative examples, the materials used for the crystalline molecules 9 include phthalocyanine (CuPc) and pentacene as described above, and the cohesion molecules of each of the cases of the cohesion matters 5 and 7 are as follows: (1) non-existent, (2) molybdenum oxide ($MoO_3$), (3) fullerene ($C_{60}$), and (4) $Alq_3$.

Verification Conditions

In these verifications, the illustrative examples of the film thickness of each layer are as follows.

First, the film thickness of the anode 46 (first metal electrode) is within the range of 1 nm to 40 nm, and is 20 nm in this example. The thickness of the cohesion molecule 7 and the crystalline molecule 9 of the orientation controlling member is 3 nm, the film thickness of the crystalline molecule 9 is 15 nm, the film thickness of the hole transporting layer 48 is 35 nm, and the film thickness of the light-emitting layer 49 is 60 nm. The film thickness of the electron injection layer 51 is 1 nm, and the film thickness of the cathode 52 (second electrode) is 80 nm. Note that the current density is, for example, 7.5 [mA/cm$^2$], and the brightness of the light-emitting layer 49 is at a similar level in each of the verifications.

For the verification results shown in FIG. 11 and FIG. 12, the materials employed for each layer include gold (Au) for the anode 46, phthalocyanine (CuPc), etc., for the crystalline molecule 9, Alq$_3$ for the light-emitting layer 49, LiO$_2$ for the electron injection layer 51, and aluminum (Al) for the cathode 52.

According to the verification results shown in FIG. 11, the driving voltage of the organic electroluminescent device 3 is as follows.

(1) In a case where the cohesion molecules are non-existent, the driving voltage of the organic electroluminescent device 3 is 13.8 [V]. Hereinafter, this driving voltage will be referred to as the "reference driving voltage." Conversely, (2) in a case where the material of the cohesion molecules is molybdenum oxide (MoO$_3$), the driving voltage of the organic electroluminescent device 3 is 5.7 [V]. (3) In a case where the material of the cohesion molecules is fullerene (C$_{60}$), the driving voltage of the organic electroluminescent device 3 is 5.8 [V]. (4) In a case where the material of the cohesion molecules is Alq$_3$, the driving voltage of the organic electroluminescent device 3 is 10.1 [V].

Thus, the driving voltage in a case where Alq$_3$ is employed as the material of the cohesion molecules is lower than the aforementioned reference voltage, making the organic electroluminescent device 3 have higher luminous efficiency as a whole. Further, the driving voltage in the case where fullerene (C$_{60}$) is used as the material of the cohesion molecules is significantly lower than the driving voltage in the case where Alq$_3$ is used as the material of the cohesion molecules. Further, the driving voltage in the case where molybdenum (MoO$_3$) is used as the material of the cohesion molecules is lower than the driving voltage in the case where fullerene (C$_{60}$) is used as the material of the cohesion molecules.

Thus, the organic electroluminescent device 3 shows a reduction in the driving voltage in the order of Alq$_3$, fullerene (C$_{60}$), and molybdenum (MoO$_3$) as the material of the cohesion molecules.

Note that, in an illustrative scenario where C$_{60}$ is used as the cohesion molecules under the same conditions as those indicated in FIG. 11 excluding the fact that the anode 46 is made of silver (Ag), the driving voltage is 5.6 [V].

The brightness will now be simply explained. According to the verification results shown in FIG. 11, the brightness of the organic electroluminescent device 3 is as follows.

(1) In a case where cohesion molecules are non-existent, the brightness of the organic electroluminescent device 3 is 270 [cd/m$^2$]. Conversely, (2) in a case where the material of the cohesion molecules is molybdenum oxide (MoO$_3$), the brightness of the organic electroluminescent device 3 is 339 [cd/m$^2$]. (3) In a case where the material of the cohesion molecules is fullerene (C$_{60}$), the brightness of the organic electroluminescent device 3 is 334 [cd/m$^2$]. (4) In a case where the material of the cohesion molecules is Alq$_3$, the brightness of the organic electroluminescent device 3 is 385 [cd/m$^2$].

On the other hand, according to the verification results shown in FIG. 12, the driving voltage of the organic electroluminescent device 3 is as follows.

(1) In a case where cohesion molecules are non-existent, the driving voltage of the organic electroluminescent device 3 is 9.1 [V]. Hereinafter, this driving voltage will be referred to as the "reference driving voltage." In comparison to this reference driving voltage, (2) in a case where the material of the cohesion molecules is molybdenum oxide (MoO$_3$), the driving voltage of the organic electroluminescent device 3 is 3.9 [V]. (3) In a case where the material of the cohesion molecules is fullerene (C$_{60}$), the driving voltage of the organic electroluminescent device 3 is 4.4 [V]. (4) In a case where the material of the cohesion molecules is Alq$_3$, the driving voltage of the organic electroluminescent device 3 is 9.4 [V].

Thus, the driving voltage in the case where fullerene (C$_{60}$) is used as the material of the cohesion molecules is significantly lower than the driving voltage in the case where Alq$_3$ is used as the material of the cohesion molecules. Further, the driving voltage in the case where molybdenum (MoO$_3$) is used as the material of the cohesion molecules is lower than the driving voltage in the case where fullerene (C$_{60}$) is used as the material of the cohesion molecules.

Thus, the organic electroluminescent device 3 shows a reduction in the driving voltage in the order of Alq$_3$, fullerene (C$_{60}$), and molybdenum (MoO$_3$) as the material of the cohesion molecules.

The brightness will now be simply explained. According to the verification results shown in FIG. 12, the brightness of the organic electroluminescent device 3 is as follows.

(1) In a case where cohesion molecules are non-existent, the brightness of the organic electroluminescent device 3 is 50 [cd/m$^2$]. Conversely, (2) in a case where the material of the cohesion molecules is molybdenum oxide (MoO$_3$), the brightness of the organic electroluminescent device 3 is 241 [cd/m$^2$]. (3) In a case where the material of the cohesion molecules is fullerene (C$_{60}$), the brightness of the organic electroluminescent device 3 is 265 [cd/m$^2$]. (4) In a case where the material of the cohesion molecules is Alq$_3$, the brightness of the organic electroluminescent device 3 is 371 [cd/m$^2$].

Verification of Surface Roughness

FIG. 13 is a table showing a verification example of a surface roughness Ra of the anode 46 on the glass substrate 45 and of each case where cohesion molecules exist on the anode 46. Note that in FIG. 13 the glass substrate 45 is omitted. In this verification example, the anode 46 is made of gold and has a film thickness of 20 [nm], and the thickness of each of the cohesion molecules is 3 [nm].

First, (1) in a case where cohesion molecules do not exist on the anode 46, the surface roughness Ra of the anode 46 is 2.6 [nm]. Hereinafter, this surface roughness will be referred to as the "reference surface roughness." In comparison with this reference surface roughness, (2) in a case where the material of the cohesion molecules on the anode 46 is molybdenum oxide (MoO$_3$), the surface roughness Ra is 9.3 [nm]. (3) In a case where the material of the cohesion molecules on the anode 46 is fullerene (C$_{60}$), the surface roughness Ra is 6.5 [nm]. (4) In a case where the material of the cohesion molecules on the anode 46 is Alq$_3$, the surface roughness Ra is 3.5 [nm].

The surface shape differs in accordance with the type of the material of the cohesion molecules on the anode 46. Regardless of material type, however, the grain size is smaller than that of the Au top surface. The surface roughness Ra increases by a multiplication factor of about 1.3 to 3.6 with the insertion of cohesion molecules having a thickness of about 3 nm. Referring to these values of the surface roughness Ra that occurred in accordance with the incorporated cohesion molecules, the driving voltage of the organic electroluminescent device 3 is inversely proportional to the surface roughness Ra. That is, it is understood that, with the organic electroluminescent device 3, the surface roughness Ra, which occurs as a result of the incorporation of cohesion molecules, increasingly contributes to a decrease in driving voltage as it increases.

The organic semiconductor device 3 of the above-described embodiment includes, between a pair of electrodes of the first metal electrode 46 (anode) and the second electrode 52 (cathode), at least, the light-emitting layer 49, the hole injection layer 47 which removes holes from the first metal electrode 46, the hole transporting layer 48 formed on a side of the first metal electrode 46 from the light-emitting layer 49 for transporting the holes removed by the hole injection layer 47 to the light-emitting layer 49, and the electron injection layer 51 formed on a side of the second electrode 52 from the light-emitting layer 49 for removing the electrons from the second electrode and supplying the electrons thus removed to the light-emitting layer, wherein the organic semiconductor device 3 comprises the crystallinity controlling member 8 (cohesion matter, cohesion molecules) which is a series of discontinuous clusters along the top surface of the hole injection layer 47 in contact with the first metal electrode 46, for controlling the orientation of the crystalline molecules 9.

With this arrangement, the crystallinity controlling member 8 (5, 7) controls the orientation in accordance with the surface roughness of the uneven top surface of the hole injection layer 47 that is positioned along the surface that comes in contact with the first metal electrode 46. As a result, holes are removed from the first metal electrode 46 and more readily moved to the hole injection layer 47, making it possible to decrease the overall driving voltage of the organic semiconductor device 3 to a greater degree than in prior art. Further, since the organic semiconductor device 3 operates at a low driving voltage, the burden placed on the device itself is alleviated, thereby extending the service life of the device further than that of prior art.

Further, in the organic semiconductor device 3 of the above-described embodiment, in addition to the aforementioned configuration, the crystallinity controlling member 8 controls the crystal orientation of the planar molecules and/or bar-shaped molecules of the crystalline molecules 9.

With this arrangement, the crystallinity controlling member 8 controls the orientation of the planar molecules and/or the bar-shaped molecules, thereby suppressing the driving voltage.

Further, in the organic semiconductor device 3 of the above-described embodiment, in addition to the aforementioned configuration, the crystallinity controlling member 8 is the cohesion matter 5 or 7 incorporated to form an uneven shape on the top surface of the hole injection layer 47.

With this arrangement, the crystallinity controlling member 5 or 7 adjusts the surface roughness of the first metal electrode 46 and the hole injection layer 47 in accordance with the incorporated cohesion matter 5 or 7, making it possible to control the orientation of the crystalline molecules 9 and reduce the driving voltage.

Further, in the organic semiconductor device 3 of the above-described embodiment, in addition to the aforementioned configuration, the crystallinity controlling member 8 is made of cohesion molecules that differ from the molecules of the material constituting the hole injection layer 47.

With this arrangement, the crystallinity controlling member 5 or 7 adjusts the surface roughness of the first metal electrode 46 and the hole injection layer 47 in accordance with the incorporated cohesion molecules, making it possible to control the orientation of the crystalline molecules 9 and reduce the driving voltage.

Further, in the organic semiconductor device 3 of the above-described embodiment, in addition to the aforementioned configuration, $MoO_3$ (molybdenum oxide) is incorporated as the cohesion molecules.

When $MoO_3$ is thus included in the crystallinity controlling member, the surface roughness of the top surface of the first metal electrode 46 (anode) increases, making it possible to suppress the driving voltage to be applied between the first metal electrode 46 and the second electrode 52 to a greater degree than in prior art. Additionally, when $MoO_3$ is used as the material for the crystallinity controlling member 8, the HOMO level or LUMO level of the $MoO_3$ molecules approaches the HOMO level or LUMO level of the pentacene molecules and the HOMO level or LUMO level of the first metal electrode 46 molecules, thereby making it possible to suppress the driving voltage.

Further, in the semiconductor device 3 of the above-described embodiment, in addition to the aforementioned configuration, $C_{60}$ (fullerene) is incorporated as the cohesion molecules.

When $C_{60}$ is thus included in the crystallinity controlling member, the surface roughness of the top surface of the first metal electrode 46 increases, making it possible to suppress the driving voltage to be applied between the first metal electrode 46 and the second electrode 52 to a greater degree than in prior art. Additionally, when $C_{60}$ is used as the material for the crystallinity controlling member 8, the HOMO level or LUMO level of the $C_{60}$ molecules approaches the HOMO level or LUMO level of the pentacene molecules and the HOMO level or LUMO level of the first metal electrode 46 molecules, thereby making it possible to suppress the driving voltage.

In the semiconductor device 3 of the above-described embodiment, $Alq_3$ is incorporated as the cohesion molecules.

When $Alq_3$ is thus included in the crystallinity controlling member 8, the surface roughness of the top surface of the first metal electrode 46 increases, making it possible to suppress the driving voltage to be applied between the first metal electrode 46 and the second electrode 52 to a greater degree than in prior art. Additionally, when $Alq_3$ is used as the material for the crystallinity controlling member, the HOMO level or LUMO level of the $Alq_3$ molecules approaches the HOMO level or LUMO level of the pentacene molecules and the HOMO level or LUMO level of the first metal electrode 46 molecules, thereby making it possible to suppress the driving voltage.

Further, in the organic semiconductor device 3 of the above-described embodiment, in addition to the aforementioned configuration, the first metal electrode 46 is gold, silver, or copper.

With this arrangement, when gold, etc., is used for the first metal electrode 46, the orientation of the crystalline molecules 9 is favorably controlled, making it possible to decrease the driving voltage.

Further, in the organic semiconductor device 3 of the above-described embodiment, in addition to the aforementioned configuration, the hole injection layer 47 contains CuPc.

With this arrangement, the driving voltage to be applied between the first metal electrode 46 and the second electrode 52 decreases, making it possible to extend the service life of the organic semiconductor device 3.

Further, in the organic semiconductor device 3 of the above-described embodiment, in addition to the aforementioned configuration, the hole injection layer 47 contains pentacene.

With this arrangement, the driving voltage to be applied between the first metal electrode 46 and the second electrode 52 decreases, making it possible to extend the service life of the organic semiconductor device 3.

Further, the organic semiconductor device 3 of the above-described embodiment, in addition to the aforementioned configuration, comprises the substrate 45 on which is layered the first metal electrode 46, the hole injection layer 47, the hole transporting layer 48, the light-emitting layer 49, the electron injection layer 51, and the second electrode 52 in that order from the bottom layer, wherein the crystalline molecules have an orientation that is greater than or equal to 1 degree and less than or equal to 90 degrees with respect to the substrate 45.

With this arrangement, when cohesion molecules having such an orientation are incorporated, the injection rate of the first metal electrode 46 and the hole injection layer 47 improves, thereby making it possible to decrease the driving voltage to be applied between the first metal electrode 46 and the second electrode 52.

Further, in the organic semiconductor device 3 of the above-described embodiment, in addition to the aforementioned configuration, the cohesion molecules employed may be of an organic material [$C_{60}$ (fullerene), carbon nanotube, $Alq_3$, etc.], fluoride material (lithium fluoride, etc.), metal oxide (MoOx, WoOx, TiOx, ZnOx, etc.), gaseous molecules (oxygen, etc.), self-assembled film (SAM film, etc.), metal, or oxide nano-colloid.

With this arrangement, the driving voltage to be applied between the first metal electrode 46 and the second electrode 52 decreases, making it possible to extend the service life of the organic semiconductor device 3.

Further, in the organic semiconductor device 3 of the above-described embodiment, in addition to the aforementioned configuration, the series of discontinuous clusters is a thin film having a rate of coverage of the top surface of the first metal electrode 46 that is greater than or equal to 1% and less than 100%.

With this arrangement, it is possible to maintain electric continuity with the first metal electrode 46 and the hole injection layer 47 while reducing the driving voltage to be applied between the first metal electrode 46 and the second electrode 52.

Further, in the organic semiconductor device 3 of the above-described embodiment, in addition to the aforementioned configuration, the light-emitting layer 49 outputs visible light from the electric field corresponding to the voltage applied between the first metal electrode 46 and the second electrode 52.

With this arrangement, the crystallinity controlling member 5 or 7 controls the orientation in accordance with the surface roughness of the uneven top surface of the hole injection layer 47 that is positioned along the surface that comes in contact with the first metal electrode 46. As a result, holes are removed from the first metal electrode 46 and readily moved to the hole injection layer 47, making it possible to decrease the overall driving voltage of the organic semiconductor device 3 to a greater degree than in prior art, even when visible light is outputted at a level similar to prior art. Further, since the organic semiconductor device 3 operates at a low driving voltage, the burden placed on the device itself is alleviated, thereby extending the service life of the device further than in prior art.

The display panel of the above-described embodiment comprises the organic semiconductor device 3 including, between a pair of electrodes of the first metal electrode 46 (anode) and the second electrode 52 (cathode), at least, the light-emitting layer 49, the hole injection layer 47 which removes holes from the first metal electrode 46, the hole transporting layer 48 formed on a side of the first metal electrode 46 (anode) from the light-emitting layer 49 for transporting the holes removed by the hole injection layer 47 to the light-emitting layer 49, and the electron injection layer 51 formed on a side of the second electrode 52 from the light-emitting layer 49 for removing electrons from the second electrode 52 and transporting the electrons thus removed to the light-emitting layer 49, wherein the organic semiconductor device 3 further comprises on the top surface of the hole injection layer 47 that is in contact with the first metal electrode 46 the crystallinity controlling member (cohesion matter, cohesion molecules) which is a series of discontinuous clusters along the top surface of the hole injection layer 47 in contact with the first metal electrode 46, for controlling the orientation of the crystalline molecules 9.

With this arrangement, the crystallinity controlling member 5 or 7 controls the orientation in accordance with the surface roughness of the uneven top surface of the hole injection layer 47 that is positioned along the surface that comes in contact with the first metal electrode 46. As a result, the holes are removed from the first metal electrode 46 and readily moved to the hole injection layer 47, making it possible to decrease the overall driving voltage of the organic semiconductor device 3 of the display panel to a greater degree than in prior art. Further, since the organic semiconductor device 3 operates at a low driving voltage, the burden placed on the device itself is alleviated, thereby extending the service life of the device further than prior art.

Such a display panel with the built-in organic semiconductor device 3 is capable of lowering the driving voltage of each of the organic semiconductor devices 3, thereby making it possible to reduce the overall power consumption. Furthermore, this display panel, in addition to the aforementioned configuration, further comprises each of the components of the organic semiconductor device 3 of embodiment 1, making it possible to achieve the same advantages as those of the organic semiconductor device 3 having such a configuration.

Embodiment 2

Embodiment 2 describes an illustrative scenario in which a solar cell has substantially the same configuration as the organic semiconductor device shown in embodiment 1. Thus, the same reference numerals as those in FIGS. 1 to 12 of embodiment 1 denote the same components and behavior, and descriptions thereof will be omitted. The following description will focus on the differences between the embodiments.

In the organic solar cell of embodiment 2, a photoelectric conversion layer is used as the organic material in place of the light-emitting layer 49 that exists in the organic semiconductor device 3 of embodiment 1, at the same location as the light-emitting layer 49. This photoelectric conversion layer has a function of separating the exciters generated on the boundary surface between the P-type material and N-type material that absorb light into holes and electric charges.

Additionally, this organic solar cell in its basic structure has an electron transporting layer formed on a side of the cathode 52 (second electrode) of the photoelectric conversion layer, in place of the above-described hole injection layer 47, hole transporting layer 48, and electron injection layer 51 layered on the aforementioned organic semiconductor device 3. This electron transporting layer has a function of removing the electric charge from the photoelectric conversion layer and transporting that charge to the cathode 52.

The organic solar cell includes a crystallinity controlling member which is a series of discontinuous clusters along the top surface of the photoelectric conversion layer that is in contact with the anode 46 (first metal electrode), for controlling the orientation of the crystalline molecules. The crystallinity controlling member here is made of the same material and components as those of the crystallinity controlling member 8 of embodiment 1, and has substantially the same function of improving the injection rate. That is, the crystallinity controlling member includes cohesion molecules such as $C_{60}$, for example.

Here, each layer of the organic solar cell, layered in the order of the anode 46, the crystallinity controlling member, the P-type material of the photoelectric conversion layer, the N-type material of the photoelectric conversion layer, the electron transporting layer, and the cathode 52, employ materials such as described below. Note that a forward slash "/" indicates a boundary between layers.

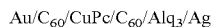

Au/$C_{60}$/CuPc/$C_{60}$/Alq$_3$/Ag

Note that the $C_{60}$ used as the N-type material (bulk) is a continuous film unlike the above-described crystallinity controlling member. The N-type material of the above-described photoelectric conversion layer has a function of a solar cell as well as a function of injecting generated holes into the anode 46.

Here, the P-type material of the aforementioned photoelectric conversion layer is referred to as an organic electron donating material (or organic electron donor layer). The material used for the organic electron donor constituting this organic electron donor layer (hereinafter sometimes referred to as "p-type layer" as well) is not particularly limited as long as the charge carrier is a hole and the material exhibits p-type semiconductor characteristics.

Specific examples of this organic electron donor include a macromolecule such as an oligomer or polymer having thiophene and derivatives thereof in its backbone, an oligomer or polymer having phenylenevinylene and derivatives thereof in its backbone, an oligomer or polymer having vinylcarbazole and derivatives thereof in its backbone, an oligomer or polymer having pyrrole and derivatives thereof in its backbone, an oligomer or polymer having acetylene and derivatives thereof in its backbone, an oligomer or polymer having isothianaphthene and derivatives thereof in its backbone, or an oligomer or polymer having heptadiene and derivatives thereof in its backbone; a low molecular weight molecule such as metal-free phthalocyanine or metal phthalocyanine and derivatives thereof, diamines or phenyldiamines and derivatives thereof, an acene such as pentacene and derivatives thereof, a metal-free porphyrin or metal porphyrin such as porphyrin, tetramethylporphyrin, tetraphenylporphyrin, diazotetrabenzporphyrin, monoazotetrabenzporphyrin, diazotetrabenzporphyrin, triatetrabenzporphyrin, octaethylporphyrin, octaalkylthioporphyrazine, octaalkylaminoporphyrazine, aminoporphyrazine, hemiporphyrazine, chlorophyll, and derivatives thereof; or a quinone pigment such as cyanine pigment, merocya, benzoquinone, or naphthoquinone. The central metals of the metal phthalocyanine and metal porphyrin employed are each a metal, metallic oxide, or metallic halide such as magnesium, zinc, copper, silver, aluminum, silicon, titanium, vanadium, chrome, manganese, iron, cobalt, nickel, tin, platinum, or lead. Note that, in particular, an organic material wherein an absorption band exists in the visible range (300 nm to 900 nm) is preferred.

On the other hand, the N-type material of the aforementioned photoelectric conversion layer is also referred to as an organic electron accepting material (or organic electron acceptor layer). The electron acceptor constituting this electron acceptor layer (hereinafter sometimes referred to as "n-type layer" as well) is not particularly limited in this application as long as the charge carrier is an electron and the material exhibits n-type semiconductor characteristics.

Specifically, the electron donor of the organic electron acceptor layer employed may be a macromolecule such as an oligomer or polymer having pyridine and derivatives thereof in its backbone, an oligomer or polymer having quinoline and derivatives thereof in its backbone, a ladder polymer based on a benzophenanthroline and derivatives thereof, or cyanopolyphenylenevinylene; or a low molecular weight molecule such as a fluorinated metal-free phthalocyanine or fluorinated metal phthalocyanine and derivatives thereof, perylene and derivatives thereof, naphthalene derivatives, or bathocuproine and derivatives thereof. Other possibilities include a modified or unmodified fullerene or carbon nanotube. Note that, in particular, similar to the aforementioned case, an organic material wherein an absorption band exists in the visible range (300 nm to 900 nm) is preferred.

In such an organic solar cell, the light that enters from an external source (hereinafter "external light") passes through the transparent substrate 45 and the anode 46, and reaches the photoelectric conversion layer. In this photoelectric conversion layer, light such as solar light is absorbed through the use of an electron donating material or electron accepting material having an absorption spectrum in the solar light spectrum, for example.

When the light is absorbed by the electron donating material, for example, exciters are generated, resulting in charge separation and the generation of electrons and holes. Of these, the electrons move to the electron accepting material and, from the cathode 52, to the anode 46 via an external electric circuit. The electrons that move to this anode 46 bond with the holes generated in the electron donating material, and return to their original state. Through the repetition of such electron movement, the organic solar cell removes electric energy from the anode 46 and the cathode 52.

Figure 14:
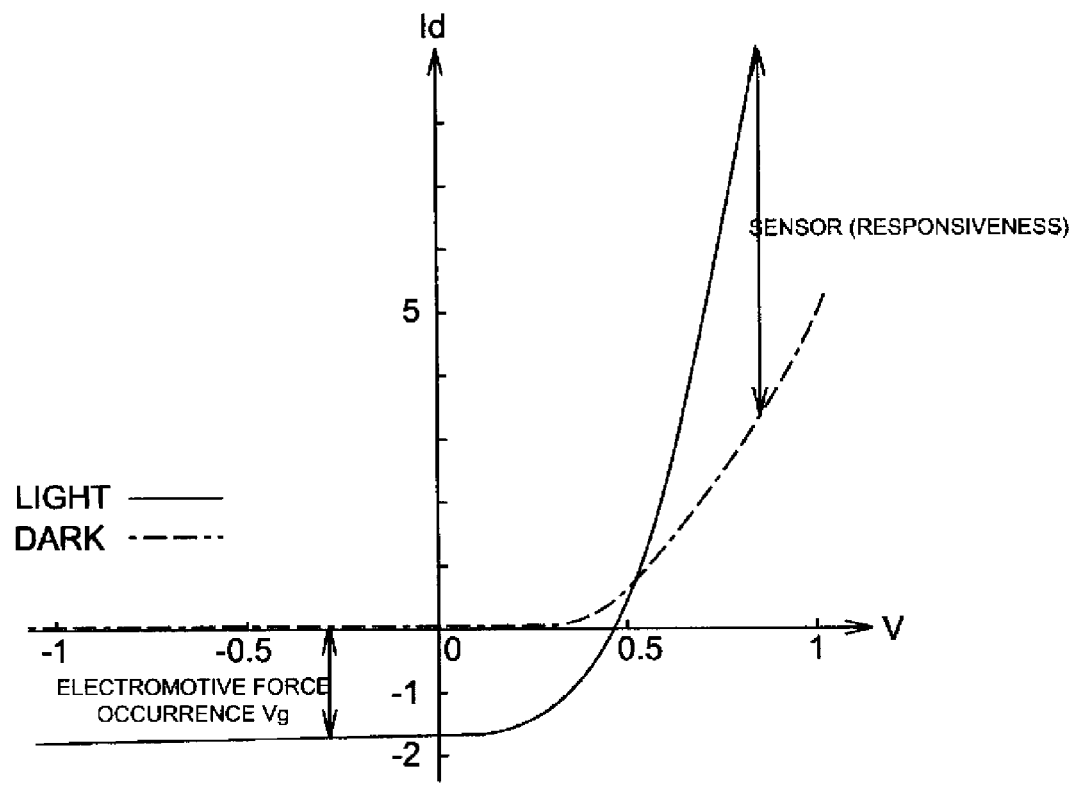
FIG. 14 is a diagram illustrating an example of the voltage and current density characteristics of the organic solar cell of embodiment 2.
Figure 15:
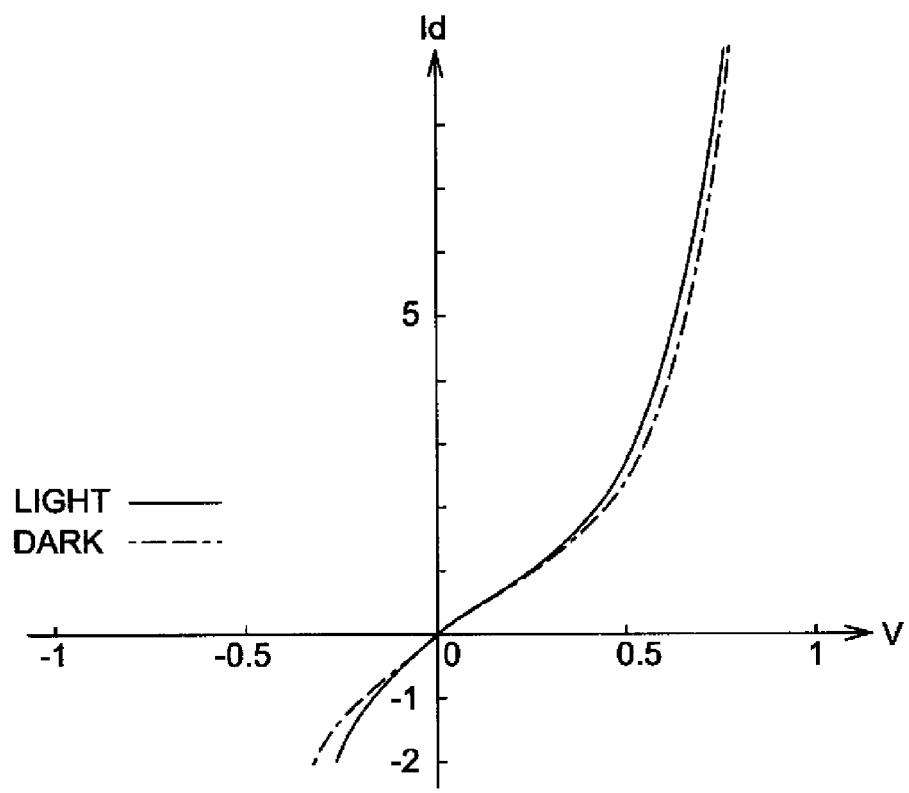
FIG. 15 is a diagram illustrating an example of the voltage and current density characteristics of a general organic solar cell.

FIG. 14 and FIG. 15 are diagrams illustrating an example of the voltage and current density characteristics of the organic solar cell. FIG. 14 illustrates an example of voltage and current density characteristics of the organic solar cell of embodiment 2, and FIG. 15 illustrates an example of the voltage and current density characteristics of a general organic solar cell for comparison purposes.

In FIG. 14 and FIG. 15, the solid line represents a state wherein the surrounding area of the organic solar cell is dark, and the dashed line represents a state wherein the surrounding area of the organic solar cell is light (irradiance level: 100 [nW/cm$^2$]). Note that the horizontal axis indicates voltage [V], and the vertical axis indicates current density Id [mA/cm$^2$]. Each parameter is as follows: $\eta$isc=0.40 [%], Voc=0.45 [V], Jsc: 1.65 [mA/cm$^2$], and FF: 0.53.

Material and Thickness of Each Layer of the Organic Solar Cell of Embodiment 2

In the organic solar cell of embodiment 2, Ag (15 nm)/$C_{60}$ (3 nm)/CuPc (40 nm)/$C_{60}$ (40 nm)/Alq$_3$ (10 nm)/Ag (50 nm)

are layered in that order from the anode 46 on the substrate 45. Note that the forward slash "/" indicates a separation between layers.

The organic solar cell of embodiment 2, as illustrated in FIG. 14, produces an electromotive force Vg [V] such as shown in the figure in accordance with the difference in the number of photons between the aforementioned case where the surrounding area is dark (equivalent to "Dark" in the figure) and the aforementioned case where the surrounding area is light (equivalent to "Light" in the figure). The electromotive force Vg [V] is thus produced as a result of the control of the orientation between the anode 46 and the hole transporting layer 48 similar to embodiment 1.

Material and Thickness of Each Layer of the General Organic Solar Cell

In the general organic solar cell, Ag (15 nm)/CuPc (40 nm)/$C_{60}$ (3 nm)/$Alq_3$ (10 nm)/Ag (50 nm) are layered in that order from the anode 46 on the substrate 45. Note that the forward slash "/" indicates a separation between layers.

On the other hand, the general organic solar cell, as illustrated in FIG. 15, exhibits minimal difference in the number of photons between the aforementioned case where the surrounding area is dark (equivalent to "Dark" in the figure) and the aforementioned case where the surrounding area is light (equivalent to "Light" in the figure), and therefore does not produce an electromotive force Vg [V] as described above. The electromotive force Vg [V] does not occur since the orientation is not controlled between the anode 46 and the hole transporting layer 48.

The organic solar cell of the above-described embodiment 2 includes, between a pair of electrodes of the first metal electrode 46 (anode) and the second electrode 52 (cathode), at least, the photoelectric conversion layer which separates the exciters generated at the boundary surface between the P-type material and N-type material that absorb light into holes and electric charges, the electron transporting layer formed on a side of the second electrode 52 from the photoelectric conversion layer for removing electrons from the photoelectric conversion layer and transporting the electrons thus removed to the second electrode 52, wherein the organic solar cell further comprises the crystallinity controlling member 8 (5, 7) which is a series of discontinuous clusters along the top surface of the photoelectric conversion layer in contact with the first metal electrode 46, for controlling an orientation of the crystalline molecules 9.

With this arrangement, the crystallinity controlling member 8 (5, 7) controls the orientation in accordance with the surface roughness of the top surface thereof, making it easier to remove the electric charge from the photoelectric conversion layer and move the charge thus removed to the cathode 52. As a result, the voltage temporarily produced between the first metal electrode 46 and the second electrode 52 becomes higher than that in prior art, making it possible to improve the overall luminous efficiency to a greater degree than prior art. Further, since the organic solar cell operates at a low driving voltage, the burden placed on the device itself is alleviated, thereby extending the service life of the device further than prior art.

In the organic solar cell of the above-described embodiment, the organic solar cell comprises substantially the same components as the organic semiconductor device 3 of the aforementioned embodiment 1, excluding the photoelectric conversion layer in place of the light-emitting layer 49, and each achieves substantially the same advantages.

Note that the embodiments of the present invention are not limited to the above, and various modifications are possible. In the following, details of such modifications will be described one by one.

In the above-described embodiments, LiF, for example, may be employed in place of the aforementioned $MoO_3$, etc., as the aforementioned cohesion molecules. Furthermore, α-sexithiophene (6T), for example, may be used as the crystalline molecules 9.

While in the above-described embodiments the anode 46 is a transparent or semitransparent electrode, the present invention is not limited thereto, allowing the anode 46 to be non-transparent.

While the above-described embodiments have been described in connection with an illustrative scenario in which gold (Au) is mainly used for the anode 46, the present invention is not limited thereto, allowing for use of the previously described oxide semiconductor of silver, copper, ITO, IZO, etc., as well as materials including platinum, molybdenum, aluminum, an inorganic compound, or fluoride.

In the above-described embodiments, an organic material such as $C_{60}$ (fullerene), carbon nanotube, or $Alq_3$, a fluoride material such as LiF (lithium fluoride), a metal oxide such as MoOx, WoOx, TiOx, or ZnOx (where x is an integer), gaseous molecules such as oxygen, a self-assembled film such as a so-called SAM film, a metal, or an oxide nano-colloid may be alternatively selected as the aforementioned cohesion molecules.

The configuration of each of the organic semiconductor devices 3 of the above-described embodiments may also be applied to a switch device or a so-called organic switch device that employs organic material. Examples of such an organic switch device include an organic transistor, for example. With this arrangement, the organic switch device is capable of achieving substantially the same advantages as the aforementioned embodiments.

While in the above-described embodiments the orientation is controlled between the anode 46 and the hole transporting layer 48 thereby decreasing the driving voltage, the present invention is not limited thereto, allowing the orientation to be controlled between the cathode 52 and the electron transporting layer 50 in substantially the same manner as the above-described embodiments, thereby decreasing the driving voltage.

Note that, in the above-described embodiments, the orientation-controlled organic semiconductor is made of a material other than an amorphous material, and has a crystalline planar or bar-shaped molecular structure.

In the above-described embodiments, the cohesion matter 5, such as the cohesion molecules, that partially covers the first metal electrode (anode) 46, does not necessarily have to be manufactured with a coverage of greater than or equal to 1% and less than 100% from the very start of the manufacturing process of the organic semiconductor device 3 or the organic solar cell, allowing the flat cohesion matter 5 to be initially manufactured so that it covers the entire surface of the first metal electrode 46 (coverage: 100%), for example, and then modified by etching or scratching, for example, so that the coverage becomes less than 100%.

Furthermore, while in the above-described embodiments cohesion molecules are incorporated into the top surface of the hole injection layer 47, etc., that faces the first metal electrode 46, the present invention is not limited thereto, allowing for use of the same configuration between the substrate 45 and the first metal electrode 46 to control the orientation, which achieves substantially the same advantages as the aforementioned embodiments.

In a case where the HOMO level of the cohesion molecules of the above-described embodiments is near the HOMO level of the substrate 45 or the HOMO level of the orientation-controlled crystalline molecules 9, the injection efficiency increases. The HOMO level of each material is Au (5.1 [eV]), CuPc (5.1 [eV]), pentacene (5.1 [eV]), $MoO_3$ (5.3 [eV], $C_{60}$ (6.0 [eV]), $Alq_3$ (5.9 [eV]), and LiF (>7 [eV]).

While in the above-described embodiments the top surface of the hole injection layer 47 of the surface that comes in contact with the first metal electrode 46 is uneven in shape, the present invention is not limited thereto, allowing for the existence of a nano-order structure (particle), for example. In such a case, the structure employed may be a so-called nano-pattern structure or a honeycomb structure. The nano-pattern structure here refers to a state where particles of a size of a several nm are interspersed to form an uneven shape.

In the organic semiconductor device 3 or the organic solar cell of the above-described embodiments, in addition to the aforementioned configuration, the above-described series of discontinuous clusters may be a structure having an uneven shape.

With this arrangement, the existence of such a structure having an uneven shape increases the surface roughness of the top surface of the hole injection layer 47, etc., of the surface that comes in contact with the first metal electrode 46, making it possible to lower the driving voltage to be applied between the first metal electrode 46 and the second electrode 52.

In the organic semiconductor device 3 or the organic solar cell of the above-described embodiments, in addition to the aforementioned configuration, the above-described structure may employ a nano-pattern structure or a honeycomb structure.

With this arrangement, the existence of such a structure having a nano-pattern structure or honey-comb structure increases the surface roughness of the top surface of the hole injection layer 47, etc., of the surface that comes in contact with the first metal electrode 46, making it possible to lower the driving voltage to be applied between the first metal electrode 46 and the second electrode 52.

Further, examples of the high crystalline molecules (that is, molecules of a material that does not readily become amorphous) in the above-described embodiments include phthalocyanine derivatives including CuPc, perylene derivatives such as PTCBI, fused polycyclic aromatics such as pentacene, and thiophene derivatives such as $\alpha$-6T, and the like. Note that the high crystalline material is not necessarily limited to low molecular materials, allowing for use of high molecular materials such as P3HT, for example.

Further, the aforementioned organic semiconductor device 3 may be employed as a sensor as well since electric current modulation is possible by irradiation of external light in a case where the anode 46 and the cathode 52 are under positive voltage.

While in the above-described embodiments the organic semiconductor device 3, etc., is layered in the order of the substrate 45, the anode 46, the cohesion molecule layer, the hole injection layer 47, and the hole transporting layer 48, etc., the present invention is not limited thereto, allowing for the layered structures below. Here, the term "cohesion molecules" refers to the section of the crystallinity controlling member 8 that is orientation controlled between the anode 46 and the hole injection layer 47 of the above-described embodiments.

In the following illustrative examples of layered structures, only the layered structure of the organic semiconductor device 3, etc., from the aforementioned substrate 45 to the location in front of the hole injection layer 47, etc., is described while indicating a separation between layers by a forward slash "/"; all other layers including and following the hole injection layer 48 are omitted for the sake of simplicity.

Layered example 1: substrate 45/cohesion molecule layer/metal layer (equivalent to the anode 46)

Layered example 2: uneven nano substrate (functioning as both the substrate 45 and the cohesion molecules; equivalent to the substrate 45)/metal layer (the anode 46)

Layered example 3: substrate 45/uneven nano metal layer (equivalent to the anode 46)

Layered example 4: substrate 45/nano structure/metal layer (equivalent to the anode 46)

Layered example 5: substrate 45/metal layer (equivalent to the anode 46)/nano structure Note that, in the above-described embodiment, in a case where the planar cohesion molecules, for example, are incorporated by deposition, the deposition speed of the cohesion molecules may vary in a predetermined form.

While the above-described embodiments have been described in connection with illustrative scenarios in which the thickness T of the crystallinity controlling member 8 is 3 nm, the present invention is not limited thereto, allowing for other preferred thicknesses according to the relationship between each layer.

What is claimed is:

1. An organic semiconductor device, comprising:
   a first metal electrode; a hole injection layer comprising a plurality of crystalline molecules;
   a hole transporting layer;
   a light-emitting layer;
   an electron injection layer;
   a second electrode; and
   a crystallinity controlling member which is a series of discontinuous clusters along a contact surface of the hole injection layer in contact with the first metal electrode, for controlling an orientation of the crystalline molecules of the hole injection layer, the crystallinity controlling member being a plurality of cohesion molecules that differ from the crystalline molecules of the hole injection layer,
   wherein the first metal electrode, the hole injection layer, the hole transporting layer, the light-emitting layer, the electron injection layer, and the second electrode are layered on a substrate in that order from a surface of the substrate, the hole injection layer removing holes from the first metal electrode, the hole transporting layer supplying holes removed by the hole injection layer to the light-emitting layer and
   each of the crystalline molecules has an orientation greater than or equal to 1 degree and less than or equal to 90 degrees with respect to the substrate.

2. The organic semiconductor device according to claim 1, wherein:
   said crystallinity controlling member controls the crystal orientation of at least one of planar molecules and bar-shaped molecules as said crystalline molecules.

3. The organic semiconductor device according to claim 1, wherein:
   $MoO_3$ is incorporated as said cohesion molecules.

4. The organic semiconductor device according to claim 1, wherein:
   $C_{60}$ is incorporated as said cohesion molecules.

5. The organic semiconductor device according to claim 1, wherein:
   $Alq_3$ is incorporated as said cohesion molecules.

6. The organic semiconductor device according to claim 3, wherein:

said first metal electrode contains gold, silver, or copper.

7. The organic semiconductor device according to claim 6, wherein:

said hole injection layer contains CuPc.

8. The organic semiconductor device according to claim 6, wherein:

said hole injection layer contains pentacene.

9. The organic semiconductor device according to claim 1, wherein:

said cohesion molecules are one of an organic material, fluoride material, metal oxide, gaseous molecules, self-assembled film, metal, or oxide nano-colloid.

10. The organic semiconductor device according to claim 1, wherein:

said series of discontinuous clusters is a thin film having a rate of coverage of a top surface of said first metal electrode of greater than or equal to 1% and less than 100%.

11. The organic semiconductor device according to claim 1, wherein:

said series of discontinuous clusters is a structure having an uneven shape.

12. The organic semiconductor device according to claim 11, wherein:

said structure has a nano-pattern structure or honeycomb structure.

13. The organic semiconductor device according to claim 1, wherein:

said light-emitting layer outputs visible light by an electric field in accordance with an applied voltage between said first metal electrode and said second electrode.

* * * * *

UNITED STATES PATENT AND TRADEMARK OFFICE
CERTIFICATE OF CORRECTION

PATENT NO. : 8,519,381 B2  Page 1 of 1
APPLICATION NO. : 12/746616
DATED : August 27, 2013
INVENTOR(S) : Takahito Oyamada It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 442 days.

Signed and Sealed this

Fifteenth Day of September, 2015

Michelle K. Lee
*Director of the United States Patent and Trademark Office*